(12) United States Patent
Hsieh et al.

(10) Patent No.: US 6,534,821 B2
(45) Date of Patent: Mar. 18, 2003

(54) STRUCTURE WITH PROTRUDING SOURCE IN SPLIT-GATE FLASH

(75) Inventors: Chia-Ta Hsieh, Tainan (TW); Yai-Fen Lin, Hsin-chu (TW); Hung-Cheng Sung, Hsin-chu (TW); Chuang-ke Yeh, Hsu-chu (TW); Wen-Ting Chu, Kaohsiung (TW); Di-Son Kuo, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/927,071

(22) Filed: Aug. 10, 2001

(65) Prior Publication Data

US 2002/0016039 A1 Feb. 7, 2002

Related U.S. Application Data

(62) Division of application No. 09/489,496, filed on Jan. 21, 2000.

(51) Int. Cl.$^7$ .............................................. H01L 29/788
(52) U.S. Cl. ........................................ 257/315; 257/288
(58) Field of Search ................................ 257/288, 315, 257/314, 321, 322, 324, 329

(56) References Cited

U.S. PATENT DOCUMENTS

| | | | |
|---|---|---|---|
| 5,063,172 A | 11/1991 | Manley | 437/43 |
| 5,824,584 A | 10/1998 | Chen et al. | 438/267 |
| 5,858,840 A | 1/1999 | Hsieh et al. | 438/266 |
| 5,879,992 A | 3/1999 | Hsieh et al. | 438/264 |
| 5,915,178 A | 6/1999 | Chiang et al. | 438/266 |
| 6,117,733 A | * 9/2000 | Sung et al. | 438/265 |
| 6,259,131 B1 | 7/2001 | Sung et al. | 257/315 |
| 6,309,928 B1 | 10/2001 | Sung et al. | 438/265 |
| 6,312,989 B1 | 11/2001 | Hsieh et al. | 438/257 |

* cited by examiner

Primary Examiner—David Nelms
Assistant Examiner—David Nhu
(74) Attorney, Agent, or Firm—George O. Saile; Stephen B. Ackerman (57) ABSTRACT

A method is disclosed for forming a split-gate flash memory cell having a protruding source in place of the conventional flat source. The vertically protruding source structure has a top portion and a bottom portion. The bottom portion is polysilicon while the top portion is poly-oxide. The vertical wall of the protruding structure over the source is used to form vertical floating gate and spacer control gate with an intervening inter-gate oxide. Because the coupling between the source and the floating gate is now provided through the vertical wall, the coupling area is much larger than with conventional flat source. Furthermore, there is no longer the problem of voltage punch-through between the source and the drain. The vertical floating gate is also made thin so that the resulting thin and sharp poly-tip enhances further the erasing and programming speed of the flash memory cell. The vertical orientation of the source structure and the floating gate and the self-alignment of the spacer control gate to the floating gate together makes it possible to reduce the memory cell substantially.

10 Claims, 12 Drawing Sheets

STRUCTURE WITH PROTRUDING SOURCE IN SPLIT-GATE FLASH

This is a division of patent application Ser. No. 09/489,496, filing date Jan. 21, 2000, A New Structure With Protruding Source In Split-Gate Flash, assigned to the same assignee as the present invention.

BACKGROUND OF THE INVENTION (1) Field of the Invention

The present invention relates to split-gate memory cells used in flash EEPROMs (Electrically Erasable Programmable Read Only Memories), and in particular, to a split-gate flash memory cell having a protruding source, and also to a method of forming the same. The protruding source increases the coupling ratio between itself and the floating gate while decreasing the coupling between the floating gate and the control gate, thereby improving the over-all erasing and programming speed of the newly disclosed flash memory cell.

(2) Description of the Related Art

Conventionally, and as it will be described in more detail later, voltage coupling between the source and the floating gate of a memory cell is achieved by providing an overlap through lateral diffusion of source implant species in the source region of the substrate. Source region is usually flat and the overlap with the floating gate is usually imprecise and not amenable to shrinking of the size of the cell for the ever increasing demands of the ultra scale integration (ULSI) of circuits. There is also the usual problem of voltage punch-through between the flat source and the drain of a cell. It is disclosed later in the embodiments of the present invention a cell structure with a protruding source which alleviates these problems.

Figure 1A:
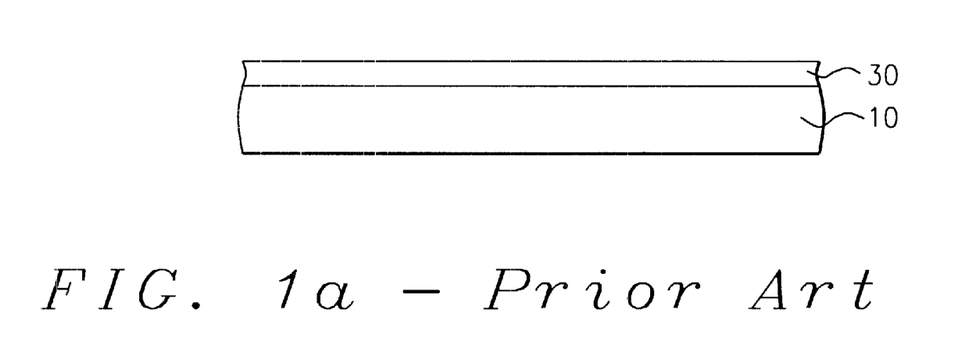
FIG. 1a is a cross-sectional view of a portion of a semiconductor substrate showing the forming of a gate oxide layer, according to prior art.
Figure 1B:
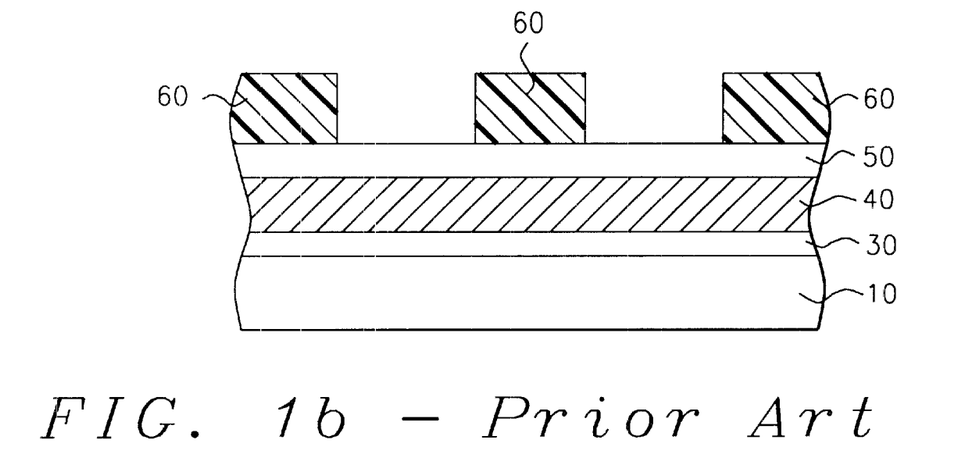
FIG. 1b is a cross-sectional view of a portion of a semiconductor substrate showing the forming of a first polysilicon layer followed by a first nitride layer over the gate oxide layer of FIG. 1a, and the patterning thereof, according to prior art.
Figure 1C:
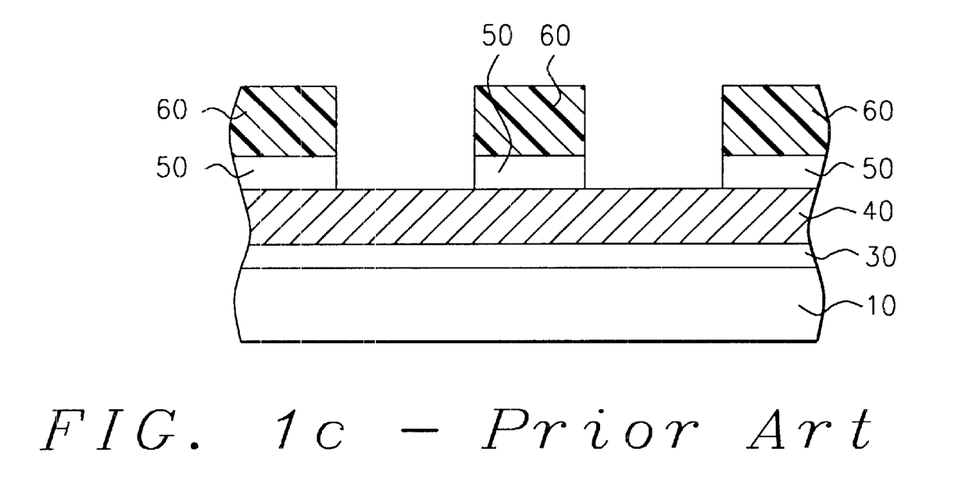
FIG. 1c is a cross-sectional view of a portion of a semiconductor substrate showing the patterning of the first nitride layer of FIG. 1b, according to prior art.
Figure 1D:
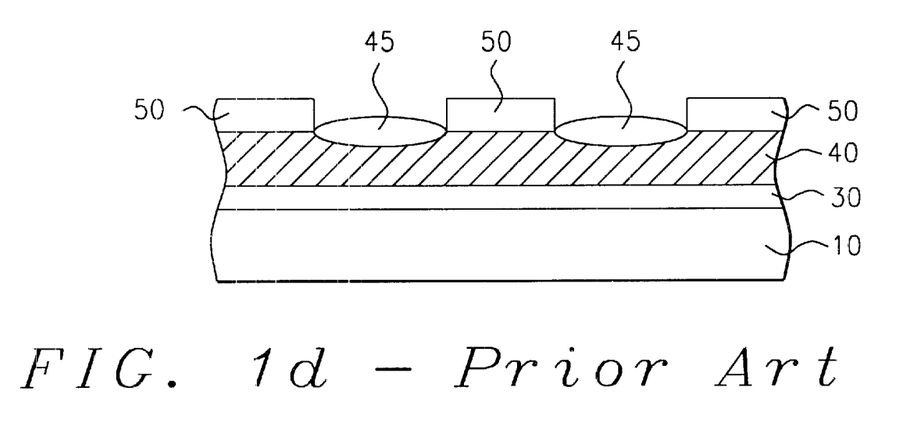
FIG. 1d is a cross-sectional view of a portion of a semiconductor substrate showing the forming of polyoxide over the polysilicon layer of FIG. 1c, according to prior art.
Figure 1E:
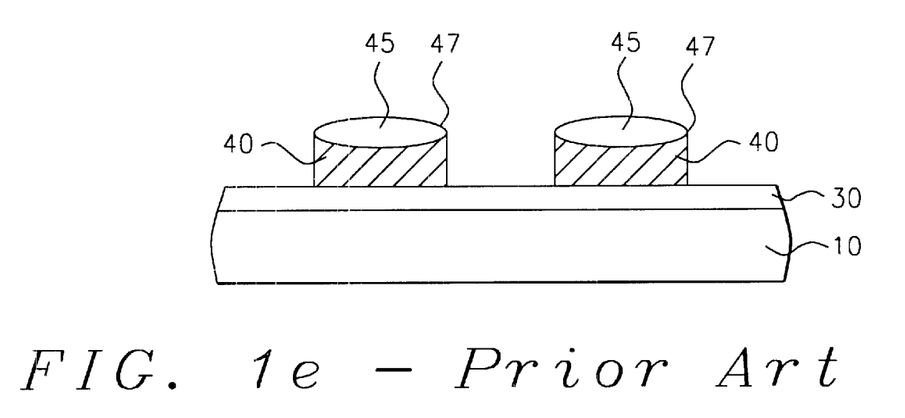
FIG. 1e is a cross-sectional view of a portion of a semiconductor substrate showing the etching of the first polysilicon layer of FIG. 1d to form a floating, according to prior art.
Figure 1F:
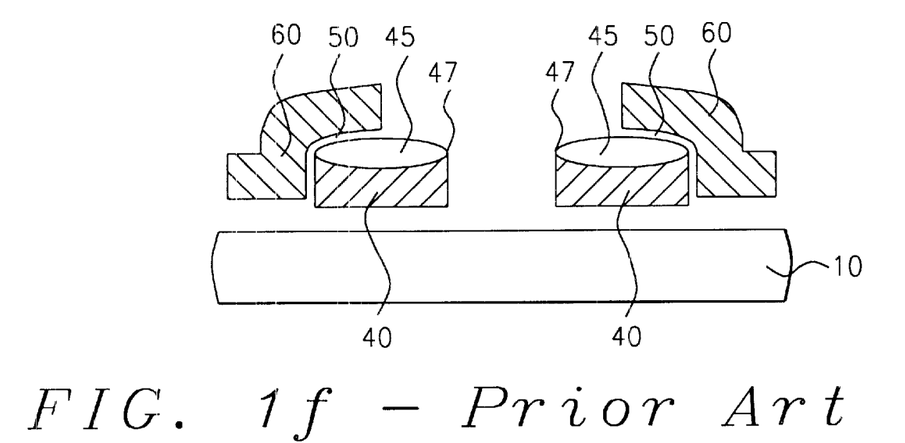
FIG. 1f is a cross-sectional view of a portion of a semiconductor substrate showing the forming of the control gate of the cell of FIG. 1e, according to prior art.

A method of forming a conventional split-gate flash memory cell is shown in FIG. 1a where a layer of gate oxide (30) is thermally grown over substrate (10). Next, a first polysilicon layer (40) is formed followed by the deposition of nitride layer (50). A photoresist layer (60) is then spun over the substrate and then patterned with a floating gate pattern as shown in FIG. 1b, which in turn, is etched into the nitride layer (50) as shown in FIG. 1c. The photoresist layer, which is no longer needed, is removed. Next, the first polysilicon that is exposed in the pattern openings in the nitride layer is oxidized to form polyoxide (45) as shown in FIG. 1d. Subsequently, the nitride layer is removed where now polyoxide (45) serves as a hard mask to remove all the first polysilicon portions except those that are covered by the polyoxide (FIG. 1e). As is well known in the art, this is usually accomplished by main etch followed by over-etch. It is at this etching step that the corner edge (47) is usually rounded off, as seen in FIG. 1e, which is not desirable for achieving fast program erase speed described below. It will be shown later in the embodiments of this invention that the sharpness of corner edge (47) can be improved such that charge transfer between substrate (10) and floating gate (40), and then the charge transfer between the floating gate and control gate, (60), is fast. The control gate is formed by depositing a second polysilicon layer over intergate layer (50), also known as interpoly, which separates the two polysilicon layers, namely, the floating polygate and the control polygate. The completed split-gate cell structure is shown in FIG. 1f.

Over the years, numerous improvements in the performance as well as in the size of memory devices have been made by varying the simple, basic one-transistor memory cell, which contains one transistor and one capacitor. The variations consist of different methods of forming capacitors, with single, double or triple layers of polysilicon, and different materials for the word and bit lines. In general, memory devices include electrically erasable and electrically programmable read-only memories (EEPROMs) of flash electrically erasable and electrically programmable read-only memories (flash EEPROMs). Many types of memory cells for EEPROMs or flash EEPROMs may have source and drains regions that are aligned to a floating gate or aligned to spacers. When the source and drain regions are aligned to the floating gate, a gate electrode for a select transistor is separate from the control gate electrode of the floating gate transistor. Separate select and control gates increase the size of the memory cell. If the source and drain regions are aligned to a spacer formed after the floating gate is formed, the floating gate typically does not overlie portions of the source and drain regions. Programming and erasing performance is degraded by the offset between the floating gate and source and drain regions.

Figure 1G:
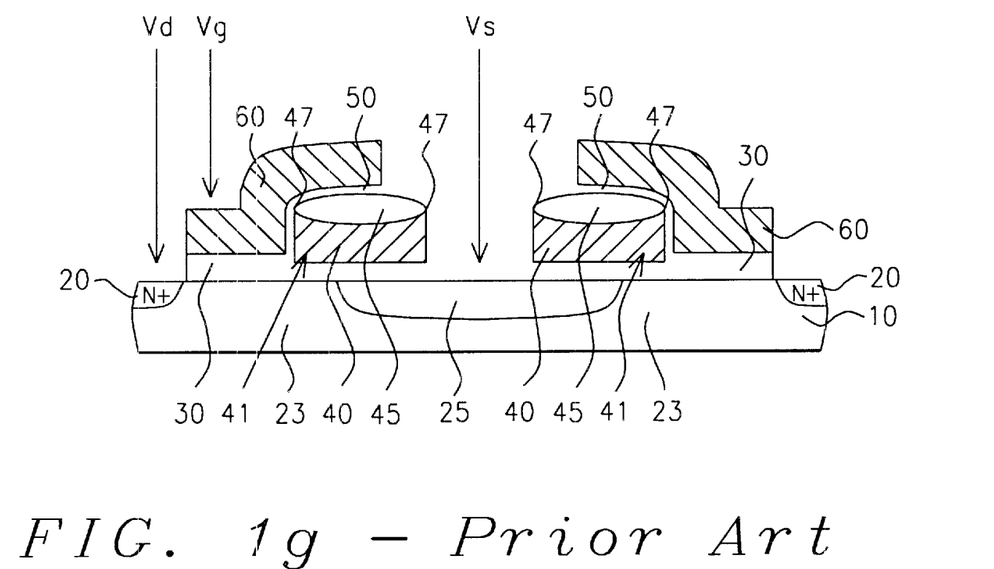
FIG. 1g is an enlarged view of FIG. 1f, showing the source and drain and the corresponding voltages, according to prior art.
Figure 1H:
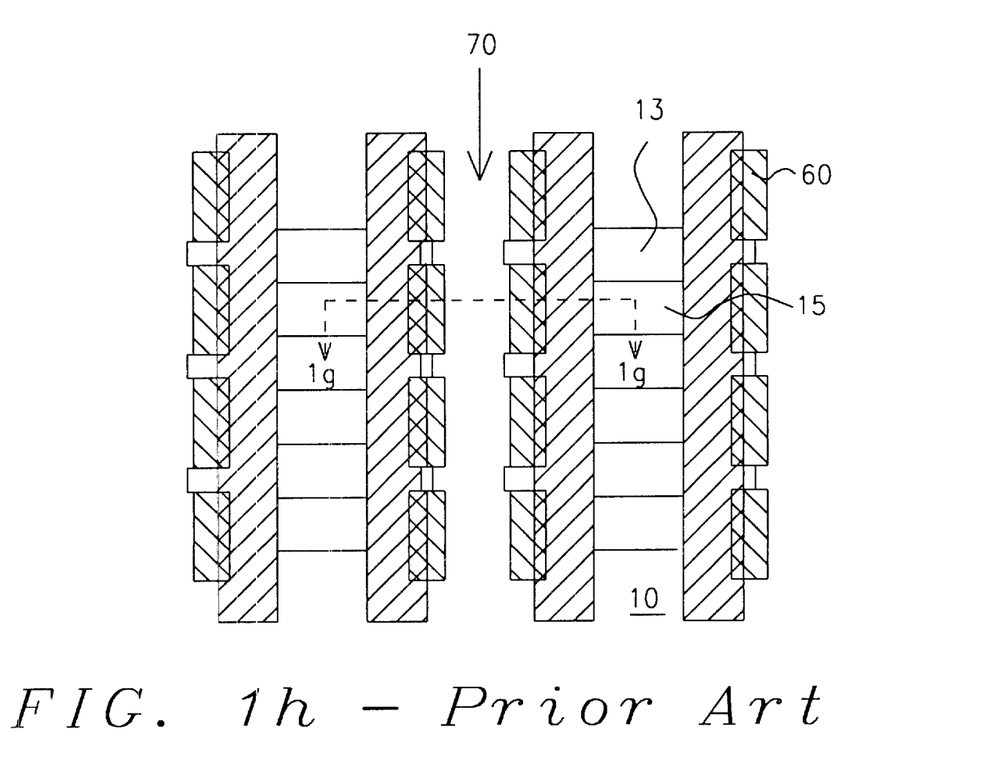
FIG. 1h is a top view showing the active and passive regions of the substrate of FIG. 1g, according to prior art.

FIG. 1g, which is an enlarged view of FIG. 1f, is a conventional flash-EEPROM cell where two MOS transistors share a common source (25). A top view is shown in FIG. 1h. FIG. 1g is a cross-sectional view of the cell taken at 1g—1g crossing active region (15) defined by passive filed oxide or isolation region (13). A top view of the shared common source line is referenced as (70) in FIG. 1h.

In the cross-sectional view 1g, the first doped region, (20), lies within the substrate. The second doped region, (25), also lies within substrate (10) and is spaced apart form the first doped region (20). Channel region (23) lies within substrate (10) and between first (20) and second (25) doped regions. Gate oxide layer (30) overlies substrate (10). Floating gate (40), to which there is no direct electrical connection, and which overlies substrate (10), is separated from substrate (10) by a thin layer of gate oxide (30) while control gate (60), to which there is direct electrical connection, is generally positioned over the floating gate with intergate oxide (50) therebetween.

To program the transistor shown in FIG. 1g, charge is transferred from substrate (10) through gate oxide (30) and is stored on floating gate (40) of the transistor. The amount of charge is set to one of two levels to indicate whether the cell has been programmed "on" of "off." "Reading" of the cell's state is accomplished by applying appropriate voltages to the cell source (25), Vs, drain (20), Vd, and to control gate (60), Vg, and then sensing the amount of charge on floating gate (40). To erase the contents of the cell, charges are removed from the floating gate by transferring them to the word line (control gate) through the gate oxide. The path of the charge transfer is shown by arrows (41) in FIG. 1g.

This programming and erasing of an EEPROM is accomplished electrically and in-circuit by using Fowler-Nordheim (FN) tunneling for erasing, and channel-hot electron (CHE) injection for programming, as is well known in the art. FN tunneling usually requires higher voltage than the CHE mechanism. It is common practice use FN tunneling for both write and erase for NAND type of cell architecture, while CHE programming and FN tunneling erasure is used for NOR circuits. The latter approach is shown in FIG. 1g. Thus, in the programming mode, source (25) is coupled to the floating gate through a high voltage which in turn creates a high electric field between floating gate (40) and control gate (60), thereby causing injection of CHEs from substrate (10) to floating gate (40) in FIG. 1g. In the erase mode, on the other hand, the control gate is impressed with a high voltage and electrons are injected from the floating gate to the control gate through the FN tunneling mechanism, usually aided by the poly tip of the floating gate.

Erasing and programming speed of a split gate flash memory cell is governed by the capacitive coupling between different parts of the cell. As it will be described more fully later, the programming and erasing of the cell is accomplished by transferring charges between polysilicon or poly parts comprising the floating gate, control gate and the source region in the device substrate. A faster erase speed is achieved if the coupling ratio between the control gate and the floating gate is low, which in turn, is attained by having a thinner floating gate as well as a sharper edge on the gate. With conventional methods of forming split gate cells, it is difficult to have low coupling ratio because of the relatively tall sidewalls of the floating gate. This is compensated to a large extent by forming a sharp edge or tip on the floating gate. On the other hand, higher programming speed is achieved if the coupling ratio between the floating gate and the source region is higher with relatively thicker gate. It is disclosed in the embodiments of the present invention a method of forming a split gate flash memory cell having a thin floating gate and a sharp poly tip in order to improve erasing and programming speed of the cell.

In U.S. Pat. No. 5,879,992, Hsieh, et al., provide a method for forming a split-gate flash memory cell having a step poly supporting an interpoly oxide of varying thickness for the purposes of improving the over-all performance of the cell. Polyoxide is formed over portions of a first polysilicon layer which in turn is partially etched to form a step adjacent to the side-wall of a floating gate underlying the polyoxide. A spacer is next formed of a hot temperature oxide over the step poly. An interpoly oxynitride is then formed and control gate is patterned overlapping the floating gate with the intervening interpoly oxide. The step poly and the spacer thereon form proper distances between the control gate and the floating gate while keeping the distance between the poly tip and the control gate unchanged so that appropriate couplings between the control gate and the floating gate, and between the floating gate and the substrate are achieved, thus improving the over-all performance of the split-gate flash memory having a step poly.

In another U.S. Pat. No. 5,858,840, Hsieh, et al., propose a method for forming a short and sharp gate bird's beak in order to increase the erase speed of a split-gate flash memory cell. This is accomplished by implanting nitrogen ions in the first polysilicon layer of the cell and removing them from the area where the floating gate is to be formed. Then, when the polysilicon layer is oxidized to form polyoxide, the floating gate region without the nitrogen ions oxidizes faster than the surrounding area still having the nitrogen ions. Consequently, the bird's beak that is formed at the edges of the polyoxide assumes a sharper shape with smaller size than that is found in prior art. This results in an increase in the erase speed of the memory cell.

A different method of making a split-gate flash EEPROM cell is disclosed by Chen, et al., in U.S. Pat. No. 5,824,584 where a sidewall select gate is formed in conjunction with a semiconductor doped oxide to form a non-volatile memory cell. The semiconductor element used to dope the oxide layer includes silicon or germanium. The nonvolatile memory cell is programmed by storing electrons in the doped oxide, and is erase using band-to-band tunneling.

Manley in U.S. Pat. No. 5,063,172 provides an integrated circuit fabrication method that utilizes a conductive spacer to define the gate length of the series select transistor in a split-gate memory cell. Since the length of the spacer can be controlled with great precision using existing integrated circuit process technologies, misalignment problems associated with the prior art split-gate cells are eliminated.

In U.S. Pat. 5,915,178 by Chiang, et al., add a shallow source side implanted region in order to improve the endurances of a split gate flash EEPROM device. The process features placing a shallow, ion implanted arsenic region, in the semiconductor substrate, adjacent to one side of a floating gate structure, prior to creation of the control gate structure. The addition of the shallow, ion implanted arsenic region, improves the coupling ratio at the source, which in turn results in the ability of the flash EEPROM device to sustain about 1,000,000 program/erase cycles, compared to counterparts, fabricated without the shallow, source side region, only able to sustain about 400,000 program/erase cycles.

In the present invention that is disclosed later in the embodiments, the flat source of prior art is replaced with a protruding source structure. The protruding source increases the coupling ratio between itself and the floating gate while decreasing the coupling between the floating gate and the control gate, thereby improving the overall erasing and programming speed of the newly disclosed flash memory cell. The cell is further enhanced by employing a spacer control gate, which, together with the protruding source, makes it possible to shrink the cell substantially.

SUMMARY OF THE INVENTION

It is therefore an object of this invention to provide method of forming a split-gate flash memory cell having a protruding source in place of the conventional flat source.

It is another object of the present invention to provide a method of forming a split-gate flash memory cell having a thin floating gate and a sharp poly-tip.

It is yet another object of the present invention to provide a method of forming a split-gate flash memory cell having a self-aligned spacer control gate and word line.

It is still another object of the present invention to provide a split-gate flash memory cell with a protruding source structure having a floating gate and a control gate formed vertically around the protruding structure in order to increase the coupling ratio between the source and the floating gate while decreasing the coupling between the floating gate and the control gate, thereby improving the over-all erasing and programming speed of the split-gate flash memory cell.

These objects are accomplished by providing a semiconductor substrate having passive and active regions defined; forming a pad oxide layer over said substrate; forming a nitride layer over said pad oxide layer; forming an opening in said first nitride layer until said substrate is reached to form a source region in said substrate; performing ion implantation to form said source region in said substrate; forming a first polysilicon (Poly-1) layer in said opening to form a protruding source structure over said source region; forming a first poly-oxide layer over said Poly-1 layer; removing said nitride layer on said substrate; removing said pad oxide layer on said substrate; forming a floating gate oxide layer over said substrate, including over said protruding source structure; forming a second polysilicon (Poly-2) layer to form a floating gate over said floating gate oxide layer; removing portions of said Poly-2 layer over said substrate to isolate active regions; forming a second poly-oxide layer over said Poly-2 layer over said substrate including over said protruding source structure by oxidizing an upper portion of said Poly -2 layer while leaving a lower portion of said Poly-2 unoxidized to form said floating gate; removing a portion of said second poly-oxide layer, thus leaving said Poly-2 layer over said substrate partially exposed in regions other than over said protruding source structure; removing said partially exposed Poly-2 layer; forming an inter-gate oxide layer over said substrate; forming a third polysilicon (Poly-3) layer over said inter-gate oxide layer; forming a Poly-3 spacer over said inter-gate oxide layer on the vertical walls of said protruding source structure to form a spacer control gate; and performing ion implantation to form a drain region of said flash cell having said protruding source structure.

These objects are accomplished further by providing a semiconductor substrate having active and passive regions defined; a source region and a drain region within said substrate; a pad oxide layer over said substrate; a protruding source structure with vertical walls having a top portion and bottom portion formed over said source region; a floating gate oxide layer formed over said vertical walls of said protruding source structure; a thin vertical floating gate having a bottom edge over said floating gate oxide; a thin and sharp poly-tip at said bottom edge of said vertical floating gate; an inter-gate oxide over said vertical floating gate, including said sharp poly-tip; and a spacer control gate over said inter-gate oxide layer.

BRIEF DESCRIPTION OF THE DRAWINGS

FIGS. 2a–2k show the top view of a portion of a semiconductor substrate of this invention, while FIGS. 3a–3m show cross-sectional views of the same substrate.

More specifically,

DESCRIPTION OF THE PREFERRED EMBODIMENTS

Referring now to the drawings, in particular to FIGS. 2a–2k and FIGS. 3a–3m, there are shown schematically steps of forming a split-gate flash memory cell having a protruding source. The protruding source increases the coupling ratio between itself and the floating gate while decreasing the coupling between the floating gate and the control gate, thereby improving the over-all erasing and programming speed of the newly disclosed flash memory cell.

Thus, the flat source of prior art is replaced with a new protruding source having vertical walls above the surface of the substrate. The floating gate is next formed wrapped around the vertical walls which provide much larger coupling area and hence, increased coupling ratio than with the conventional flat source. Coupling, therefore, is no longer governed by conventional diffusional overlap over a flat source. The floating gate is made very thin so that a sharp poly tip is formed which in turn enhances the erasing and programming speed of the cell through decreased coupling between the floating gate and the control gate, or the word line. At the same time, the length of the floating gate is defined by forming a polyoxide rather than by photolithographic means, which makes cell shrinking easier. The word line, on the other hand, is formed by employing a poly spacer method which provides better alignment between the floating gate and the control gate, thereby making it possible to reduce the cell size further.

More specifically, FIGS. 2a–2k show the top views of semiconductor substrate (100), preferably silicon, at different process steps of forming the protruding source structure of the split-gate flash cell of the invention. FIGS. 3a–3m are cross sections taken at the corresponding cuts shown in FIGS. 2a–2j. Thus, in FIG. 2a, a top view of active regions (110) are shown delineated by passive isolation regions (120), and a cross-section taken at 3a–3a, an active region, is shown in FIG. 3a. These regions are formed following conventional techniques where local oxidation of semiconductor (LOCOS) method or shallow trench isolation (STI) method, or still others, may be employed.

Figure 2A:
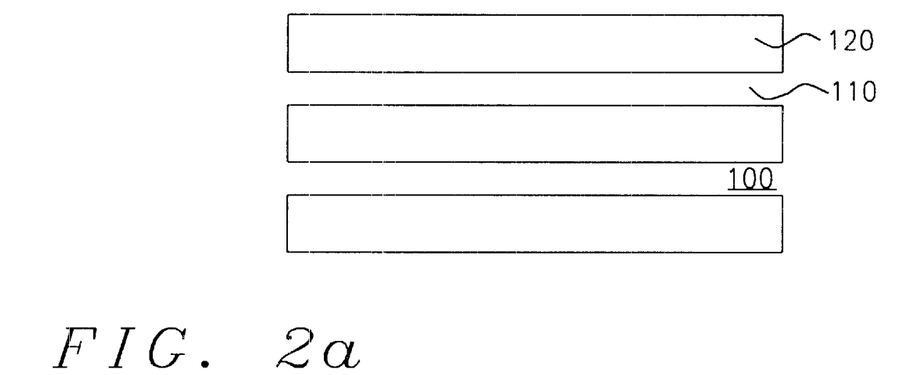
FIGS. 2a&3a are top and cross-sectional views, respectively, of a semiconductor substrate showing the forming of active region and passive regions of the memory cell of the present invention.
Figure 2B:
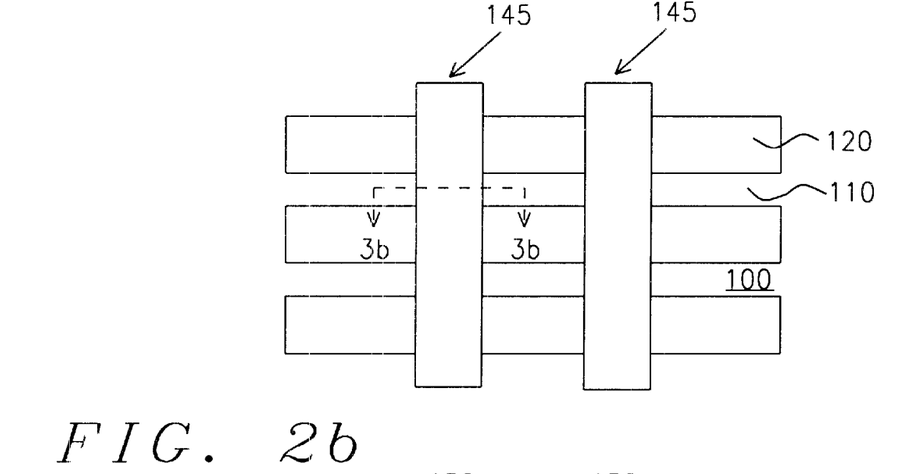
FIGS. 2b&3b are top and cross-sectional views, respectively, of a semiconductor substrate showing the forming of a source region in the active region of FIG. 2b, according to the present invention.
Figure 3A:
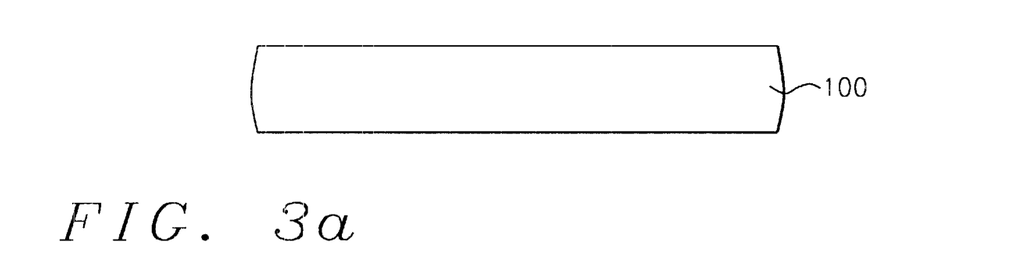
Figure 3B:
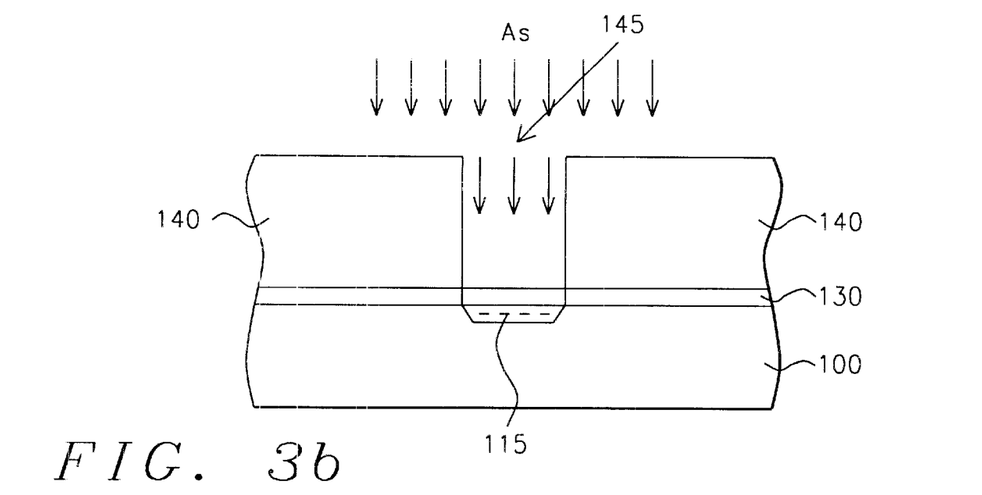

Next, pad oxide layer (130) is formed over substrate (100), as shown in FIGS. 2b and 3b. It is preferred that pad oxide (130) has a thickness between about 90 to 110 angstroms (Å). It can be formed by thermal oxidation process at a temperature between about 950° C. to 1150° C. Then, nitride layer (140) is formed over the pad oxide layer by reacting dichlorosilane ($SiCl_2H_2$) with ammonia ($NH_3$) in an LPCVD at a temperature between about 700 to 800° C. It is preferred that the thickness of the nitride layer is between about 2900 to 3100 Å. The nitride layer is next patterned using conventional photolithographic methods (not shown) and etched to form opening (145) over an active region in the substrate. The etching of the nitride layer is preferably performed in a high density plasma (HDP) etcher.

As an important aspect of the present invention, substrate (100) is next implanted with arsenic (As) ions a dosage level between about $1\times10^{15}$ to $1\times10^{16}$ atoms/cm$^2$ and energy level between about 20 to 60 KeV to form source region (115). In another words, the commonly used phosphorus (P) is not preferred as P ions are lighter in comparison with As ions, and the former will diffuse more laterally causing the commonly encountered voltage punch-through between the source and the drain to be formed. Thus, in FIG. 3b, source region (115) is shown to narrow down rather than expand in conformance with the placement of arsenic ions as they travel into the substrate during implant. It is important that pad oxide is not removed until after the implanting is performed in order to protect the substrate from implant damage. Subsequently, pad oxide is removed by using recipe HF or buffered-oxide etch (BOE) wet solution until substrate surface is reached, as shown in FIG. 3b. The depth of opening (145) is between about 3000 to 3200 Å.

Figure 2C:
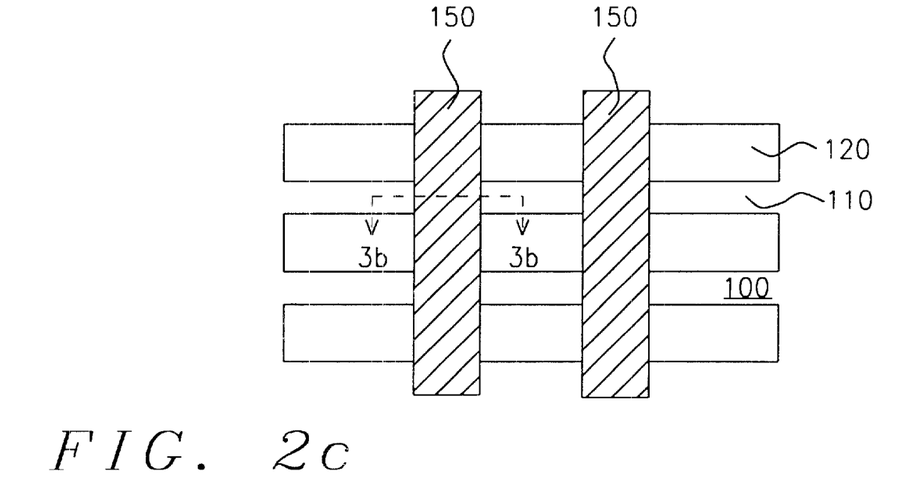
FIGS. 2c&3c are top and cross-sectional views, respectively, of a semiconductor substrate showing chemical-mechanical polishing/etch-back and forming of a protruding polysilicon layer over the substrate of FIG. 3b, according to the present invention.
Figure 2D:
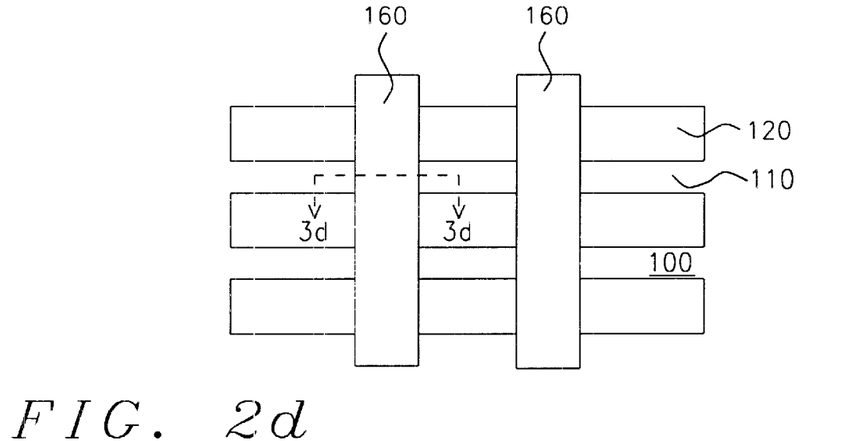
FIGS. 2d&3d are top and cross-sectional views, respectively, of a semiconductor substrate showing the forming of a poly-oxide layer over the protruding polysilicon layer of FIG. 3c, according to the present invention.
Figure 2E:
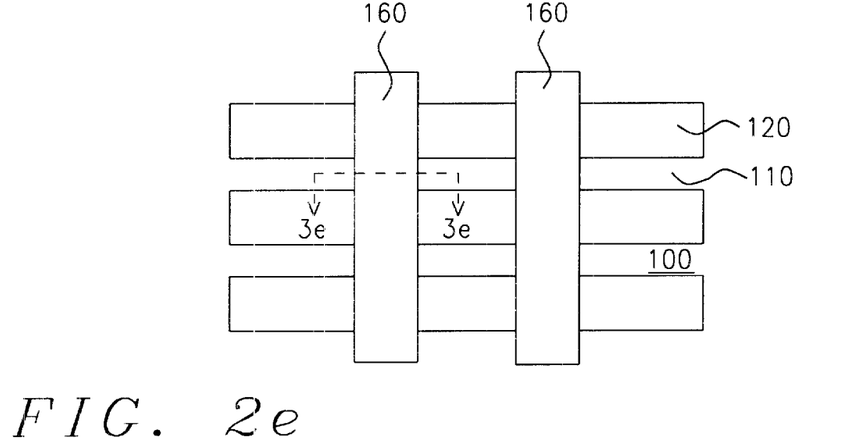
FIGS. 2e&3e are top and cross-sectional views, respectively, of a semiconductor substrate showing the protruding source structure of the present invention.
Figure 3C:
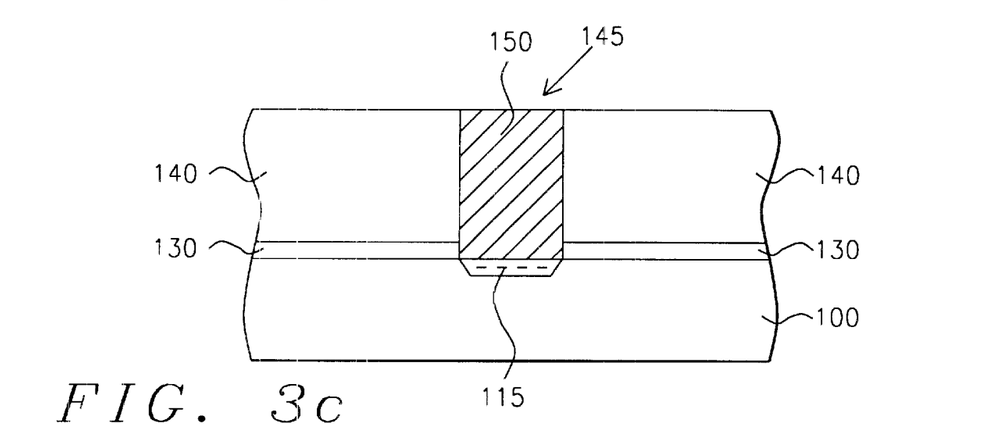
Figure 3D:
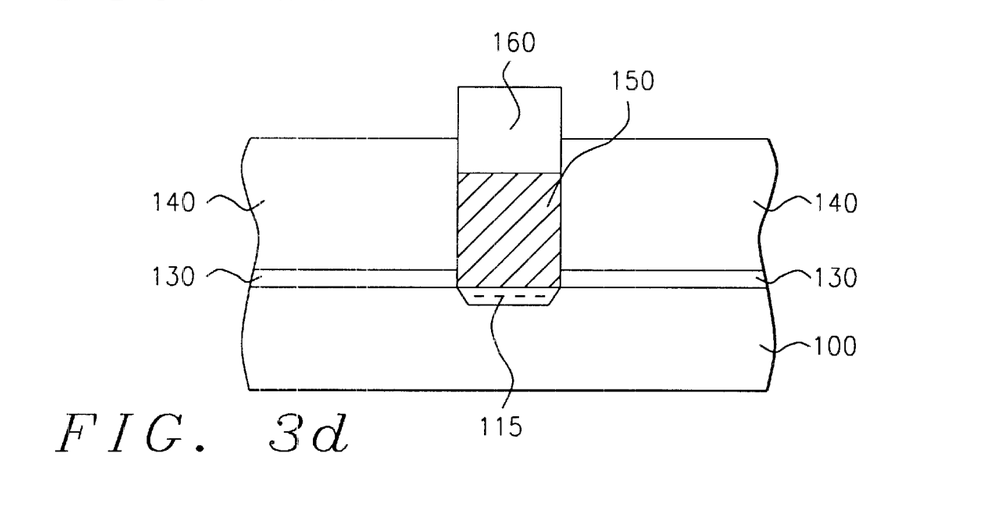
Figure 3E:
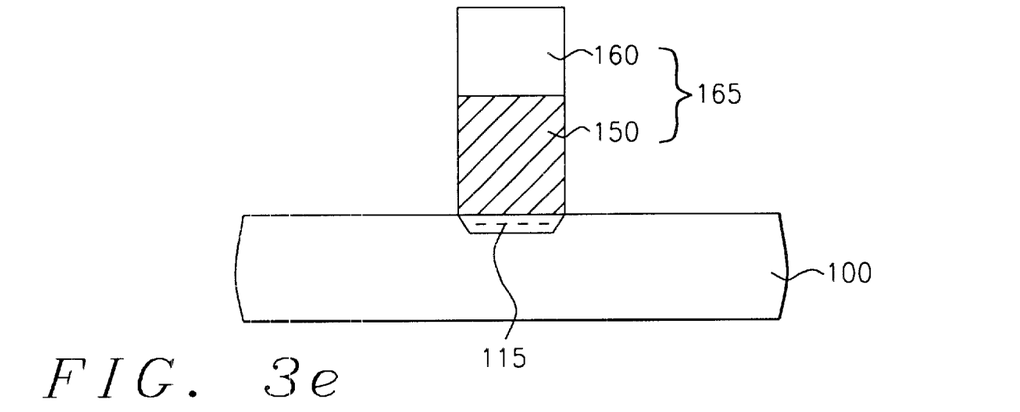

At the next step, hole (145) is filled with first polysilicon (Poly-1) layer (150) in order to form the main feature of the present invention, namely, the protruding source structure. The filling is accomplished through methods including but not limited to Low Pressure Chemical Vapor Deposition (LPCVD) methods, Chemical Vapor Deposition (CVD) methods and Physical Vapor Deposition (PVD) sputtering methods employing suitable silicon source materials, preferably formed through a LPCVD method employing silane $SiH_4$ as a silicon source material at a temperature range between about 600 to 650° C. The preferred thickness of the Poly-1 layer is between about 3900 to 4100 Å, and any excess over the substrate is removed by chemical-mechanical polishing (CMP), as shown in FIGS. 2c and 3c. The upper portion of the first polysilicon in the hole is oxidized to form first poly-oxide layer (160) shown in FIG. 3d, which is a cross-section taken at 3d–3d shown in FIG. 2d. The oxidation is performed wet at a temperature between about 750 to 900° C. The thickness of the first poly-oxide layer is between about 1900 to 2100 Å, and it will be noted that the poly-oxide grows beyond the surface of substrate (100), as seen in FIG. 3d. After the forming of first polysilicon layer (150) and first poly-oxide layer (160) in opening (145), the surrounding nitride layer (140) and the underlying pad oxide layer (130) are removed from the surface of the substrate, leaving a protruding structure with vertical walls over the source region of the substrate, namely, the featured protruding source structure, (165), of the present invention as shown in FIG. 3e. The removal of the nitride and pad oxide layers is accomplished by using a wet etch solution comprising phosphine, $H_3PO_4$.

Figure 2F:
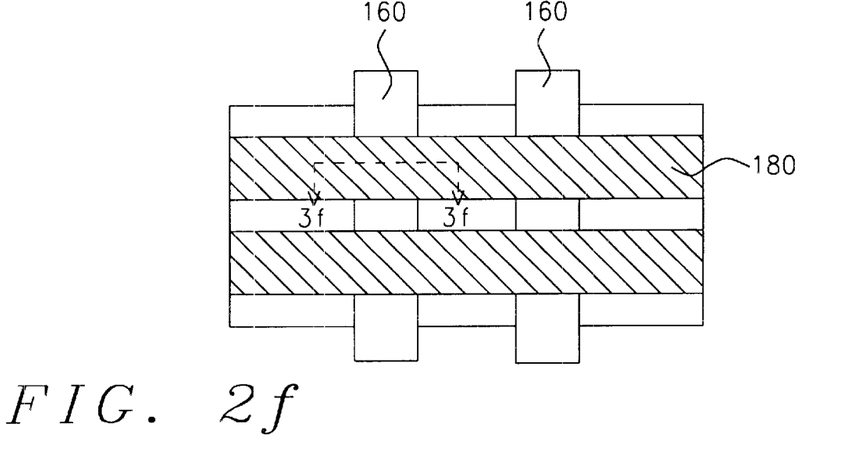
FIGS. 2f&3f are top and cross-sectional views, respectively, of a semiconductor substrate showing the forming of the second polysilicon layer, according to the present invention.
Figure 3F:
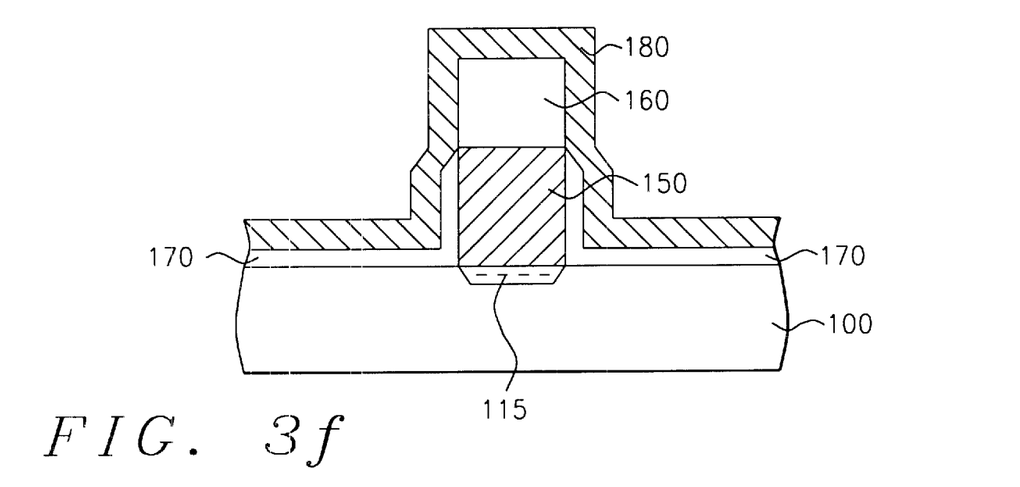

Next, floating gate oxide layer (170) is thermally grown over the substrate, including over the protruding source structure, as shown in FIG. 3f. Preferably, the gate oxide has a thickness between about 75 to 85 Å, and is formed at a temperature between about 850 to 950° C. Alternatively, the gate oxide can be formed by an atmospheric or low pressure chemical vapor deposition (LPCVD) process as is well known. This is followed by the forming of a second polysilicon (Poly-2) layer over the substrate. However, it is important that the second polysilicon layer be relatively thin having a thickness between about 350 to 450 Å. Poly-2 layer is then patterned, using conventional photolithographic methods, so that the floating gate region (180) for the cell is defined, as shown in FIG. 2f and the active regions are isolated from each other. The etching of Poly-2 is accomplished with a recipe comprising gases HBr and $Cl_2$. FIG. 3f is a cross-section of the cell taken through 3f—3f in FIG. 2f.

Figure 2G:
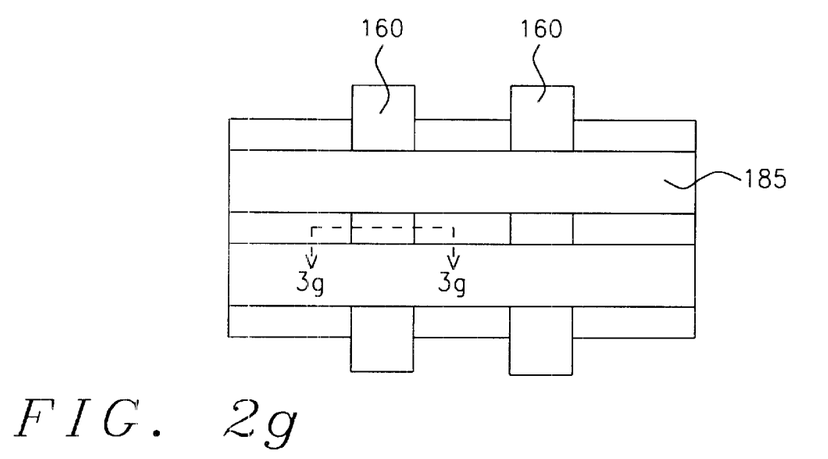
FIGS. 2g&3g are top and cross-sectional views, respectively, of a semiconductor substrate showing the forming of the second poly-oxide layer, according to the present invention.
Figure 2H:
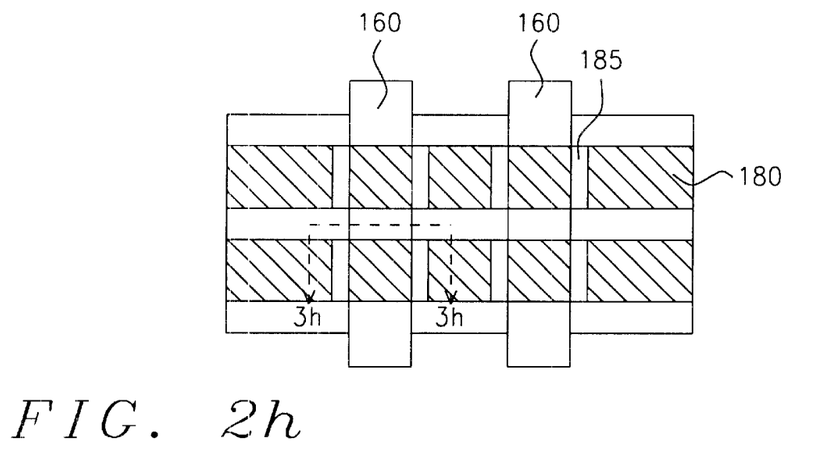
FIGS. 2h&3h are top and cross-sectional views, respectively, of a semiconductor substrate showing the removal of the second poly-oxide layer excepting from the vertical walls of the protruding source structure of the present invention.
Figure 2I:
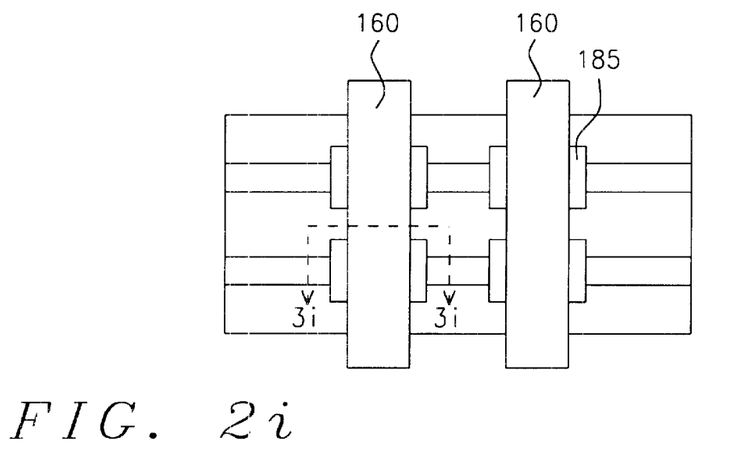
FIGS. 2i&3i are top and cross-sectional views, respectively, of a semiconductor substrate showing the forming of the vertical floating gate of the present invention.
Figure 3G:
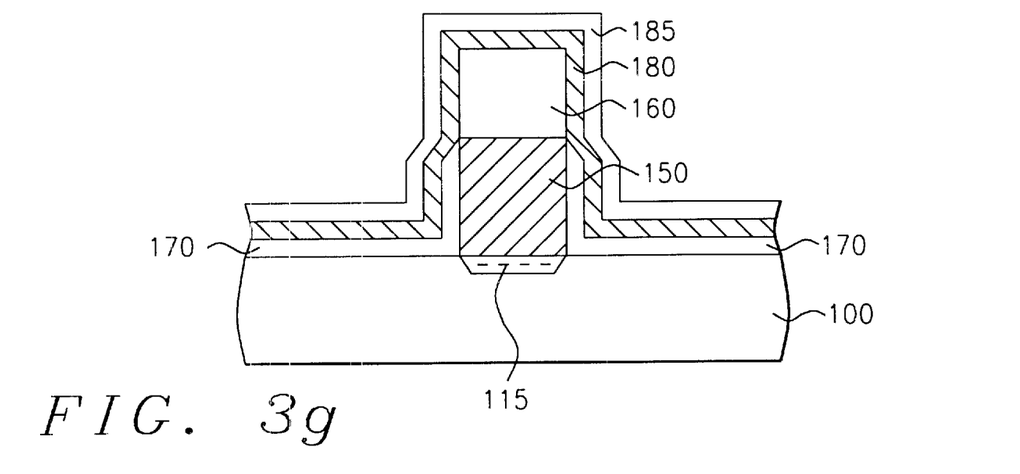
Figure 3H:
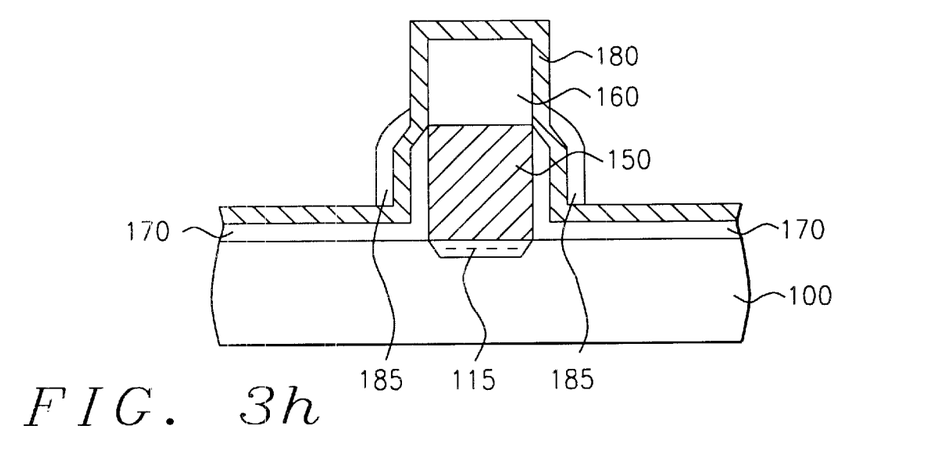

Second polysilicon layer (180) is next wet oxidized at a temperature between about 800 to 950 to form a second poly-oxide layer in the upper portion, or, part, (185) of Poly-2 as shown in FIGS. 2g and 3g. The preferred thickness of layer (185) is between about 550 to 650 Å. It will be noted that the remaining, underlying part of the Poly-2 layer (180) has a thickness only between about 90 to 110 Å, and will serve as a thin floating gate of this invention. The second poly-oxide layer is etched so that only a portion along the vertical wall of the protruding source structure remains covering the Poly-2 layer, as shown in FIGS. 2h and 3h. The etching is accomplished with a recipe comprising gases $CHF_3$, $CF_4$ and $N_2$. The exposed Poly-2 layer over the substrate, including over the protruding source structure, and the underlying gate oxide layer are next removed, as shown in FIGS. 2i and 3i, using a recipe comprising gases HBr and $Cl_2$.

Figure 2J:
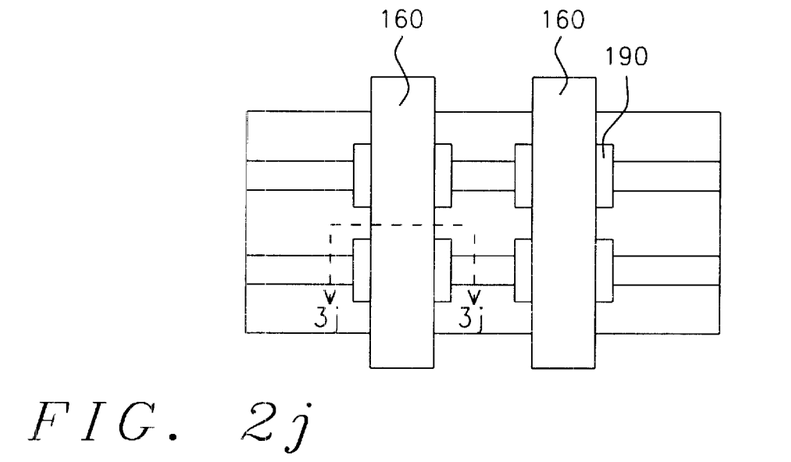
FIGS. 2j&3j are top and cross-sectional views, respectively, of a semiconductor substrate showing the forming of the inter-gate oxide layer over the substrate of the present invention.
Figure 3I:
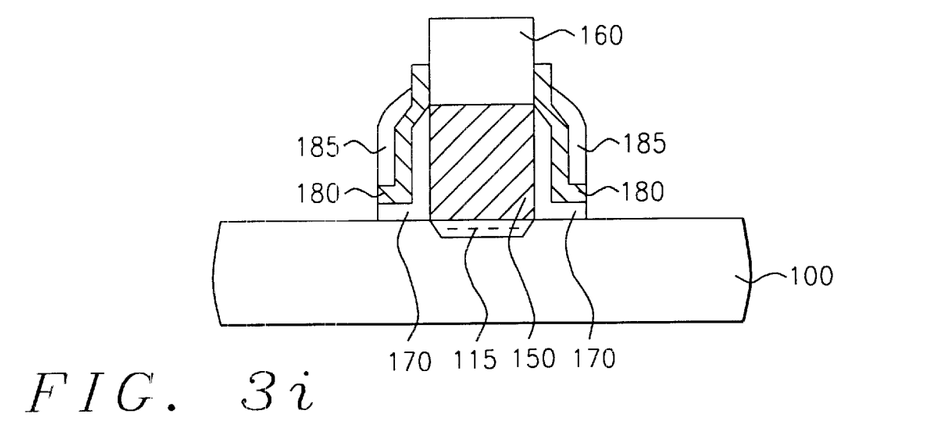
Figure 3J:
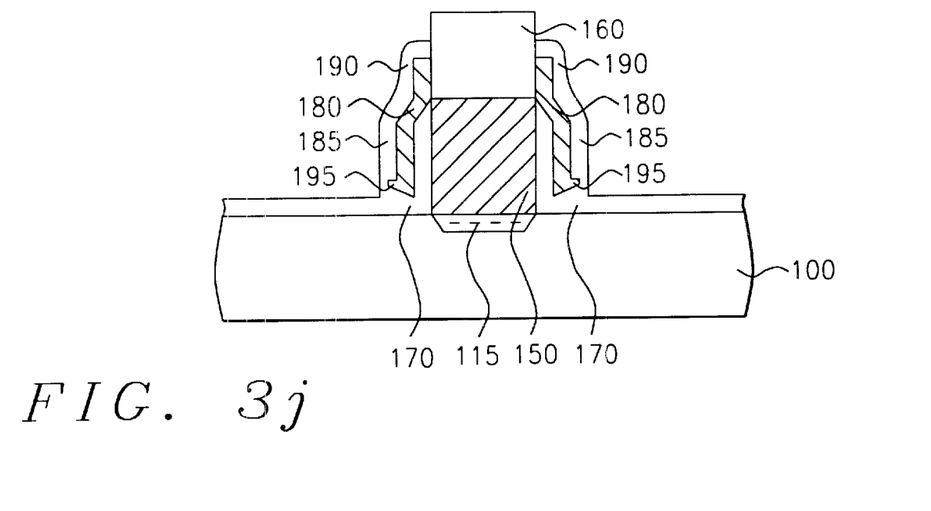

It will be noted in FIG. 3i that the vertical dimension of Poly-2, the floating gate of the cell, is defined by the second poly-oxide. That is, side-wall poly-oxidation is used in place of the conventional lithographic methods in defining a floating gate, with the attendant advantages of providing more cell shrinking capabilities than possible with prior art. The substrate, including the upper exposed end of Poly-2 is next covered by forming an inter-gate oxide layer along the vertical walls of the protruding source structure as shown in FIGS. 2j and 3j. Inter-gate oxide layer (190) is thermally grown at a temperature between about 800 to 950° C. to a preferred thickness between about 140 to 160 Å. Alternatively, a hot temperature oxide may also be used. However, thermal growth is preferred because, as a key aspect of the present invention, thermal growth promotes the forming of a thin and sharp poly-tip (195) on the edge of the Poly-2 layer, as shown in FIG. 3j. The poly-tip has a thickness between about 50 to 80 Å. Thus, the thin floating gate along with the sharp poly-tip of the present invention decrease the coupling ratio of the floating gate to the control gate to be formed, thereby improving the erasing and programming speed of the split-gate flash memory cell.

Figure 2K:
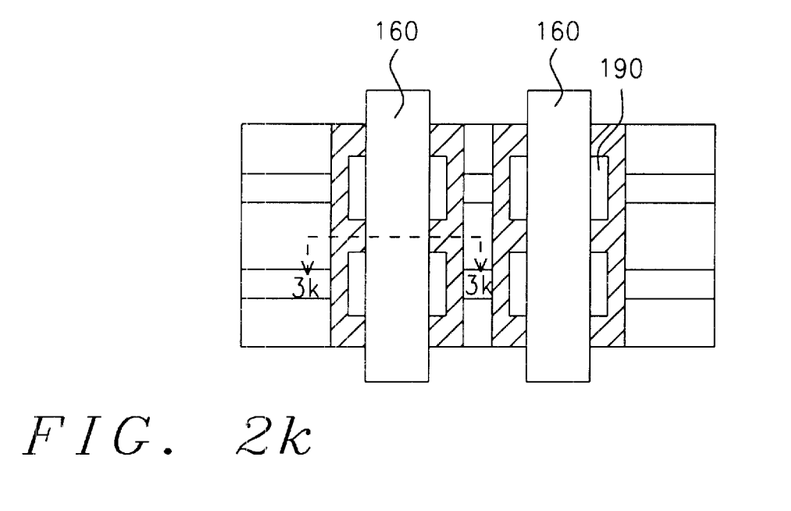
FIGS. 2k&3k are top and cross-sectional views, respectively, of a semiconductor substrate showing the forming of the spacer control gate of the present invention.
Figure 3K:
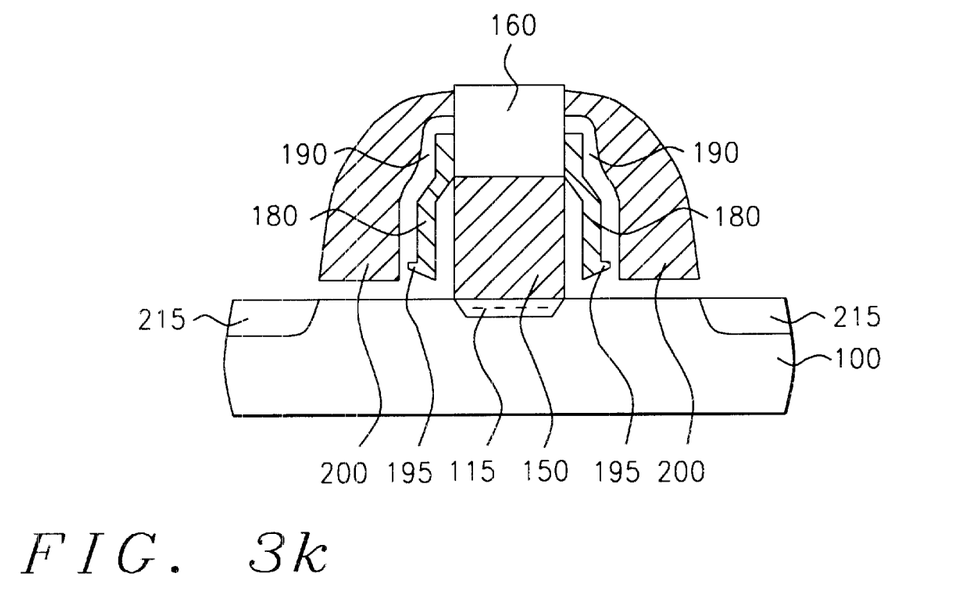

The control gate (and the associated word-line) is formed by depositing a third polysilicon layer (Poly-3) over the inter-gate oxide layer. The polysilicon is preferably formed through a LPCVD method employing silane $SiH_4$ as a silicon source material at a temperature range between about 600 to 650° C. The preferred thickness of Poly-3 layer is between about 1900 to 2100 Å. Then, the third polysilicon layer is etched to form a poly-3 spacer (200), which will serve as a control gate to a word-line, as shown in FIG. 3k. It will be noted that the Poly-3 spacer, that is, the word line is self-aligned to the floating gate, which in turn is aligned to the protruding source structure of the invention. A top view of the substrate at this step is shown in FIG. 2k.

The completion of the split-gate is accomplished by performing drain implant by using phosphorus P ions is at a dosage level between about $1 \times 10^{15}$ to $1 \times 10^{16}$ atoms/cm$^2$, and energy level between about 20 to 60 KeV to form drain (215) shown in FIG. 3k.

Figure 3L:
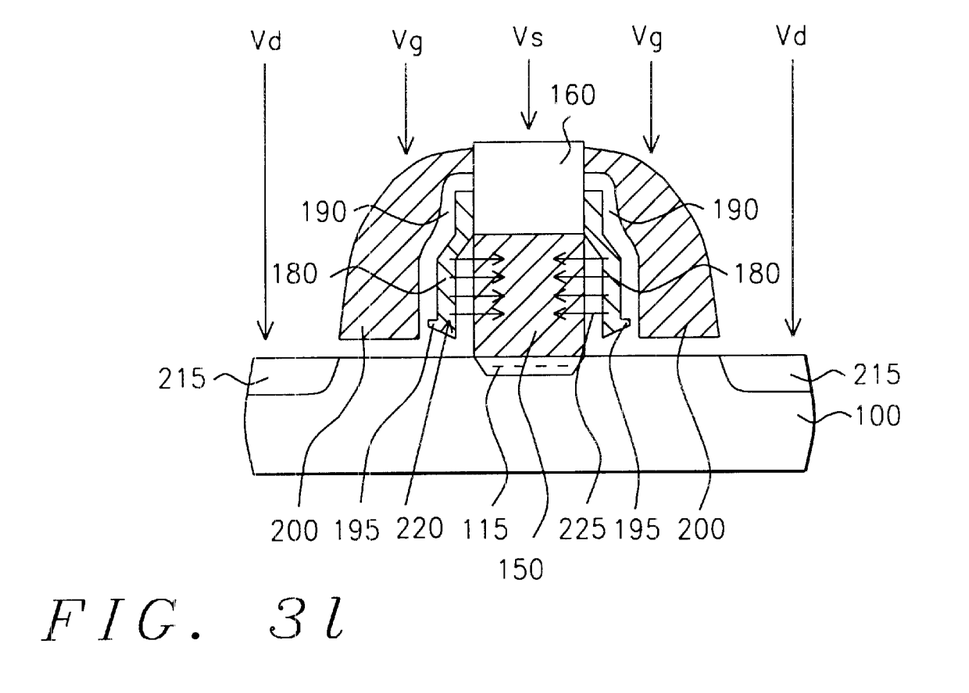
FIG. 3l is a cross-sectional view of a substrate showing the programming of the split-gate flash memory cell of this invention, featuring the protruding source structure of the invention.
Figure 3M:
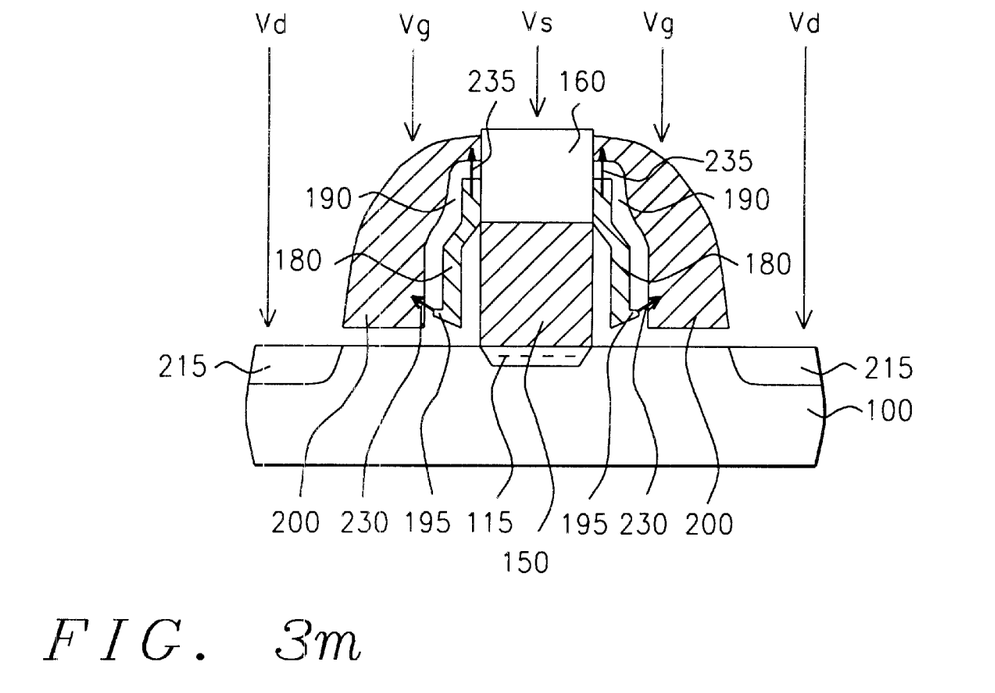
FIG. 3m is a cross-sectional view of a substrate showing the erasing of the split-gate flash memory cell of this invention, featuring the protruding source structure of the invention.

The programming and erasing of the split gate with the protruding source structure of the present invention are shown in FIGS. 3l and 3m. In the programming mode, electron transfer from the substrate to the floating gate occurs through paths (220) and (225) shown in FIG. 3l. In the erase mode, charge is transferred from the floating gate through paths (230) and (235), as shown in FIG. 3m.

Voltage levels corresponding to those shown in FIGS. 3l and 3m for the programming and erasing of the presently disclosed split-gate flash memory cell with protruding source structure are given in the table below:

|  | Vd | Vg | Vs |
| --- | --- | --- | --- |
| Programming | 1 V | 2 | 9.5 |
| Erasing | 0 V | 11 | 0 |

While the invention has been particularly shown and described with reference to the preferred embodiments thereof, it will be understood by those skilled in the art that various changes in form and details may be made without departing from the spirit and scope of the invention.

What is claimed is:

1. A split-gate flash with a protruding source structure comprising:

providing a semiconductor substrate having active and passive regions defined;

a source region and a drain region within said substrate;

a pad oxide layer over said substrate;

a protruding source structure with vertical walls having a top portion and bottom portion formed over said source region, the top portion comprising a poly-oxide having a thickness between about 1900 to 2100 Å;

a floating gate oxide layer formed over said vertical walls of said protruding source structure;

a thin vertical floating gate having a bottom edge over said floating gate oxide;

a thin and sharp poly-tip at said bottom edge of said vertical floating gate;

an inter-gate oxide over said vertical floating gate, including said sharp poly-tip; and a spacer control gate over said inter-gate oxide layer.

2. The protruding source structure of claim 1, wherein said pad-oxide has a thickness between about 90 to 110 Å.

3. The protruding source structure of claim 1, wherein said source region is implanted with arsenic ions at a dosage level between about $1 \times 10^{15}$ to $1 \times 10^{16}$ atoms/cm$^2$ and energy level between about 20 to 60 KeV.

4. The protruding source structure of claim 1, wherein said drain region is accomplished with phosphorus P ions at a dosage level between about $1 \times 10^{15}$ to $1 \times 10^{16}$ atoms/cm$^2$ and energy between about 20 to 60 KeV.

5. The protruding source structure of claim 1, wherein said bottom portion of said protruding source structure comprises a polysilicon layer having a thickness between about 3900 to 4100 Å.

6. The protruding source structure of claim 1, wherein said floating gate oxide layer has a thickness between about 75 to 85 Å.

7. The protruding source structure of claim 1, wherein said thin vertical floating gate has a thickness between about 90 to 110 Å.

8. The protruding source structure of claim 1, wherein said thin and sharp poly-tip has a thickness between about 50 to 80 Å.

9. The protruding source structure of claim 1, wherein said inter-gate oxide has a thickness between about 140 to 160 Å.

10. The protruding source structure of claim 1, wherein said spacer control comprises polysilicon having a thickness between about 190 to 2100 Å.

* * * * *